US009520880B2

(12) United States Patent
Eversmann et al.

(10) Patent No.: US 9,520,880 B2
(45) Date of Patent: Dec. 13, 2016

(54) CONFIGURABLE ANALOG FRONT ENDS FOR CIRCUITS WITH SUBSTANTIALLY GATE ENCLOSED INNER ELECTRODE MOSFET SWITCH

(71) Applicant: Texas Instruments Deutschland GmbH, Freising (DE)

(72) Inventors: Bjoern Oliver Eversmann, Zolling (DE); Ralf Brederlow, Poing (DE)

(73) Assignee: TEXAS INSTRUMENTS DEUTSCHLAND GMBH, Freising (DE)

( * ) Notice: Subject to any disclaimer, the term of this patent is extended or adjusted under 35 U.S.C. 154(b) by 51 days.

(21) Appl. No.: 14/170,052

(22) Filed: Jan. 31, 2014

(65) Prior Publication Data

US 2015/0222268 A1    Aug. 6, 2015

(51) Int. Cl.
*G01P 1/10* (2006.01)
*H03K 19/094* (2006.01)

(52) U.S. Cl.
CPC .............. *H03K 19/09407* (2013.01)

(58) Field of Classification Search
CPC ............. H03K 17/04106; H03K 17/04163; H03K 17/302; H03K 17/687; H03K 17/6871; H03K 17/6872; H03K 2017/6878; H04K 27/0002
See application file for complete search history.

(56) References Cited

U.S. PATENT DOCUMENTS

| | | | | |
|---|---|---|---|---|
| 3,866,064 A | * | 2/1975 | Gregory | H03K 17/6872 327/437 |
| 4,473,761 A | * | 9/1984 | Peterson | H03K 17/04163 327/382 |
| 4,529,897 A | * | 7/1985 | Suzuki | H03K 17/6872 327/437 |
| 4,985,647 A | * | 1/1991 | Kawada | H03K 17/693 326/108 |
| 4,985,703 A | * | 1/1991 | Kaneyama | H03K 17/693 327/408 |
| 5,410,192 A | * | 4/1995 | Yamada | H03K 17/693 326/106 |
| 5,617,055 A | * | 4/1997 | Confalonieri | H03K 17/6872 327/403 |
| 5,767,733 A | * | 6/1998 | Grugett | H03K 17/063 327/436 |

(Continued)

*Primary Examiner* — Jason M Crawford
*Assistant Examiner* — Kurtis R Bahr
(74) *Attorney, Agent, or Firm* — John R. Pessetto; Charles A. Brill; Frank D. Cimino

(57) ABSTRACT

A configurable integrated circuit (IC) includes a substrate having a semiconductor surface that the IC is formed within and thereon. The IC includes a configurable Analog Front End (cAFE) including at least one circuit module or input/output (IO), an analog switch having at least a first substantially gate enclosed Metal Oxide Semiconductor Field Effect Transistor (SGEFET) having a gate stack including a gate on a gate dielectric, a source, and a drain. The drain or source is a substantially gate enclosed (SGE) inner electrode relative to the gate, and the other of the source and the drain is outside the gate. The inner electrode of the first SGEFET is directly coupled to an analog bus. A switch control provides control signals to at least the gate of the first SGEFET for controlling a connectivity between the circuit module and/or the IO and the analog bus.

18 Claims, 11 Drawing Sheets

(56) References Cited

U.S. PATENT DOCUMENTS

| | | | | |
|---|---|---|---|---|
| 5,880,620 | A * | 3/1999 | Gitlin | G11O 5/146 327/388 |
| 6,002,156 | A * | 12/1999 | Lin | H01L 27/0277 257/356 |
| 6,144,327 | A * | 11/2000 | Distinti | G06J 3/00 341/126 |
| 6,304,987 | B1 * | 10/2001 | Whetsel, Jr. | G01B 31/318555 714/724 |
| 6,348,831 | B1 * | 2/2002 | Baba | H03K 17/04106 327/408 |
| 7,420,469 | B1 * | 9/2008 | Oliver | G06K 19/07749 340/572.1 |
| 8,766,701 | B1 * | 7/2014 | Sood | H03K 17/223 326/39 |
| 2005/0092985 | A1 * | 5/2005 | Hovel | H01L 22/14 257/48 |
| 2011/0231157 | A1 * | 9/2011 | Alley | H03M 1/1225 702/187 |
| 2013/0082740 | A1 | 4/2013 | Thomsen | |

* cited by examiner

CONFIGURABLE ANALOG FRONT ENDS FOR CIRCUITS WITH SUBSTANTIALLY GATE ENCLOSED INNER ELECTRODE MOSFET SWITCH

FIELD

Disclosed embodiments relate to electronic circuits, and more particularly to semiconductor devices including configurable Analog Front Ends and analog buses.

BACKGROUND

Some microcontroller unit (MCU) or in general System-on-Chip (SoC) circuit development efforts have included switch-enabled configurable Analog Front Ends (cAFE's) to provide highly configurable analog circuitry. High configurability is a strategic advantage in the marketplace. For example, a single SoC having cAFEs can be customized by the user for connections, functions, and parametrics for use in a variety of different user' applications.

Moreover, available built-in self-test (BIST) for such devices reduces test cost. These cAFE-based circuit designs include an integrated analog bus with configurable connections generally provided by conventional linear Metal Oxide Semiconductor Field Effect Transistors ((MOSFETs) for providing the switching to enable the flexible configurable signal routing and processing provided.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize the parasitic properties of conventional linear Metal Oxide Semiconductor Field Effect Transistor (MOSFET) switches in configurable analog integrated circuits (ICs) result in capacitance and diode leakage in switching configurations which can limit the circuit performance and/or configurability of the circuit. It is also recognized a significant portion of these parasitics result from the extension in size of the source or drain (S/D) area of the MOSFET to allow their implementation.

Disclosed embodiments include configurable ICs enabled by including disclosed MOSFETs in the switching circuit(s) having a non-standard device layout, comprising a substantially gate enclosed (SGE) inner electrode, referred to herein as a SGEFET, such as for providing a configurable Analog Front Ends (cAFE). The inner electrode (source (S) or drain (D), which as known in the art may in actual operation under certain bias conditions be possibly dynamically switching from their nominal designation as a S or a D) of the SGEFET is connected to an analog bus that general includes a plurality of bus lines for connecting circuit components (or circuit modules) to each other, as well as to input and output (I/O) ports. "Analog" bus lines as used herein mean that these bus lines have transmission characteristics selected for analog signal transmissions.

As used herein, "substantially gate enclosed" for a disclosed SGEFET refers to the inner S diffusion or inner D diffusion having at least three sides (270 degrees) surrounded by the gate (G) of the MOS transistor, which includes Ring-FETs in which the G completely surrounds (360 degrees) the inner electrode. Disclosed SGEFETs may be contrasted with conventional linear MOSFETs that have a linear layout where the G is linear in shape and is positioned between the S and the D.

Disclosed embodiments include configurable AFEs including SGEFETs having an analog bus that provides connectivity of multiple inputs and outputs of multiple modules or circuits in almost any arbitrary way. In contrast, dedicated conventional AFEs have reduced connectivity, either being between two modules or between one module and multiple pads.

The inner electrode for disclosed MOSFETs is recognized to have a substantially lower inner area and thus parasitics as compared to a S or D electrode of a conventional linear MOSFET. Parasitic properties of disclosed SGEFETs have been found to be generally about ¼ of the parasitic properties of a conventional linear MOSFET, which allows more disclosed MOSFET-based switches to be placed on the IC and/or provide lower diode leakage currents and parasitic switch capacitance. One particular application of disclosed cAFEs is for microcontroller units (MCU's), where disclosed SGEFET are used in switches implemented within the cAFE.

As used herein a "highly-cAFE" is a resource pool including a plurality of configurable analog circuit modules, which can be interconnected by a configurable analog bus enabled by disclosed SGEFETs as switching elements. The resource pool being interconnected can include a plurality of different analog circuits including, but not limited to, power amplifiers (PAs), analog-to-digital converters (ADCs), digital-to-analog converters (DACs), which can be partly redundant (e.g., 2 PA's in a given cAFE).

The configurable analog bus may provide more than one interconnection option for most routes (i.e., multiple paths such as bus lines between two circuit module terminals). Alternatively, the resource pool of circuit modules can include identical circuits or cells (i.e., array(s)), and in this case a single line may be multiplexed to a subset of all the circuits or cells.

BRIEF DESCRIPTION OF THE DRAWINGS

Reference will now be made to the accompanying drawings, which are not necessarily drawn to scale, wherein.

DETAILED DESCRIPTION

Figure 1A:
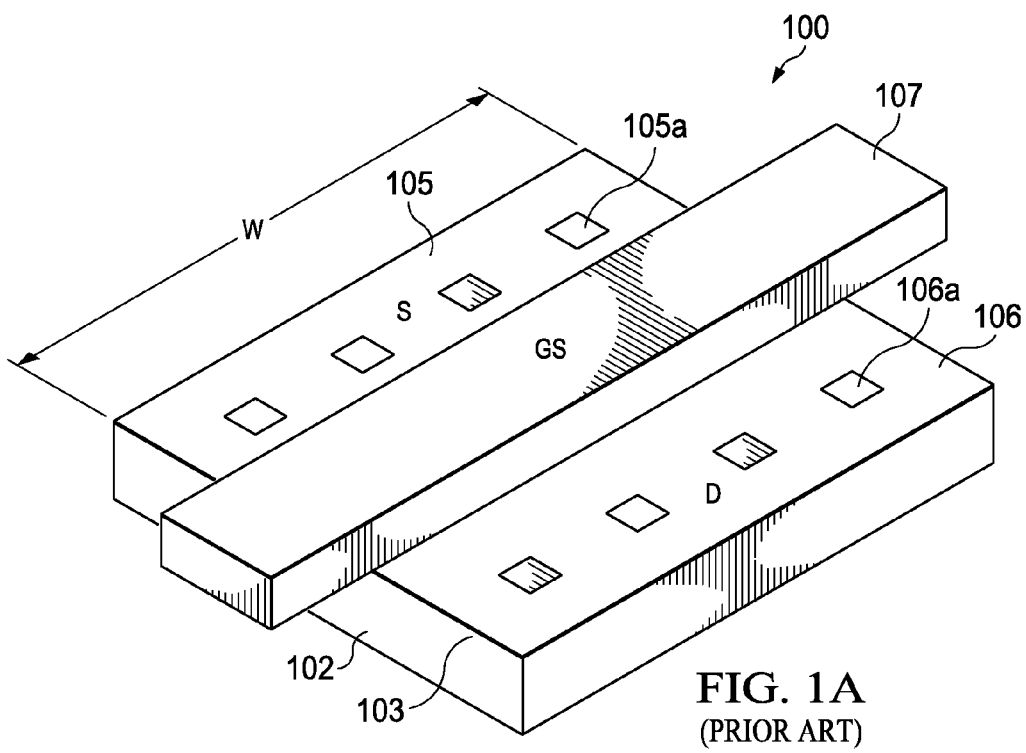
FIG. 1A is a top perspective view of the layout of a conventional linear MOSFET.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A is a top perspective view of the layout of a conventional linear MOSFET 100. MOSFET 100 is shown built on a substrate 102 having a semiconductor surface 103. The width of MOSFET 100 is shown as W. MOSFET 100 includes a Source (S) 105, Drain (D) 106 and gate stack (GS) 107 comprising a gate electrode on a gate dielectric (not shown). Rectangular contacts to the D 106a and rectangular contacts to S 105a are shown. The S and D for MOSFET 100 are identical in size (area) and other characteristics including parasitic capacitance, and are only differentiated by their layout and resulting biasing during circuit operation.

Figure 1B:
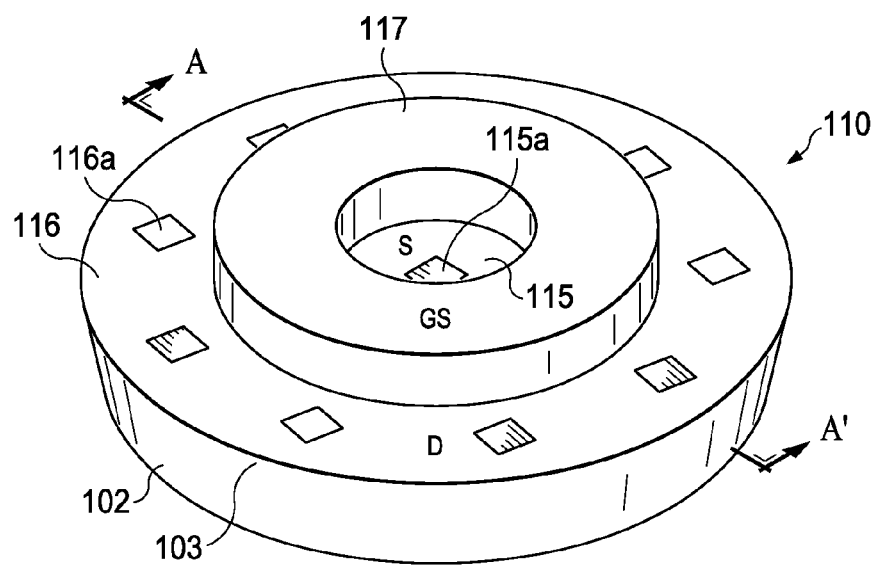
FIG. 1B is a top perspective view of the layout of an example SGEFET shown as a Ring-FET having its inner electrode being fully encircled by the gate stack.

FIG. 1B is a top perspective view of the layout of a circular Ring-FET 110 (hereafter Ring-FET). Ring-FET is shown built on a substrate 102 having a semiconductor surface 103. Ring-FET 110 includes an inner Source (S) 115, outer Drain (D) 116 and gate stack (GS) 117 comprising a gate electrode on a gate dielectric (not shown in FIG. 1B, see FIG. 1C) that completely encloses the S 115. Rectangular contacts to the D 116 are shown as 116a, and rectangular contacts to source 115 are shown as 115a. The contact shape for disclosed embodiments is not limited to rectangular. Moreover, the ring need not be circular.

Ring-FET 110 can be seen to use a significantly larger area in layout as compared to linear MOSFET 100, and unlike linear MOSFET 100 which has optional substrate (body) connections, disclosed SGEFETs such as Ring-FET 110 need connections to the semiconductor surface 103 or to the substrate 102 (or body) to properly operate. Regarding MOS transistor parasitics, the parasitics for disclosed SGEFETs are only lower on the inner-side of the SGEFET' gate (S 115 in FIG. 1B) as compared to linear MOSFET 100.

The SGEFET's parasitics are higher than the linear MOSFET 100 parasitics on the outer side of the SGEFET's gate (D 116 in FIG. 1B). Accordingly, simply by using SGEFETs (such as Ring-FET 110) for a switch or multiplexer as disclosed herein does not necessarily reduce parasitic loading, because the parasitic reduction on one side of the G is counterbalanced by a parasitic increase on the other side of the G. These differences likely explain why Ring-FET devices prior to this Disclosure have generally only been used as transistor elements for radiation hardened circuits, and not as standard components, such as in transmission gates in Process Development Kits (PDK) provided by manufacturers for IC designers.

However, disclosed embodiments recognize significant savings in parasitics when SGEFETs (such as Ring-FET 110) are used to form a multiplexer to connect a single line, input, or circuit to a large number of multiple different lines, inputs, circuits, . . . . , where there is a direct connection between the low parasitic inner electrode contact to the single line being multiplexed. This situation is uncommon in IC design and only occurs when building a disclosed highly configurable AFE with multiple interconnection options, or an array.

As noted above, besides rectangular, other electrode contact shapes may be used, such as circular. Although Ring-FET 110 is marked "prior art", Ring-FET 110 is only known for radiation hardened IC devices, not for a highly configurable AFE with multiple interconnection options or an array as disclosed herein.

Figure 1C:
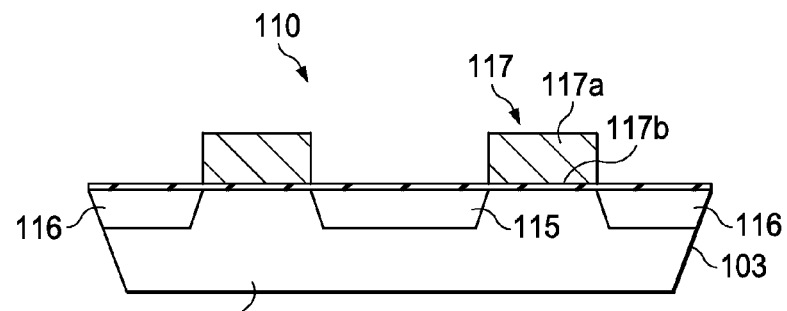
FIG. 1C is a cross sectional view of the Ring-FET along the cut line A-A' depicted in FIG. 1B.

FIG. 1C is a cross sectional view of the Ring-FET 110 along the cut line A-A' depicted in FIG. 1B. Ring-FET 110 includes a substrate 102 having a semiconductor surface 103, which may be an elementary semiconductor such as silicon, germanium, or diamond (carbon). Substrate 102 and its semiconductor surface 103 may also comprise a compound semiconductor such as silicon carbide, gallium arsenide, indium arsenide, and indium phosphide, in bulk form or with an epitaxial semiconductor surface 103 on a substrate 102. Substrate 102 may also comprise an alloy semiconductor such as silicon germanium (SiGe), germanium carbide, gallium arsenic phosphide, and gallium indium phosphide. According to some embodiments, substrate 102/semiconductor surface 103 may comprise a semiconductor-on-insulator (SOI) structure. According to other embodiments, substrate 102/semiconductor surface 103 may comprise a p-type doped region and/or an n-type doped region. For example, substrate 102/semiconductor surface 103 may include p-type dopants (e.g., a pwell) for an n-type MOS (NMOS) transistor or n-type dopants (e.g., an nwell) for a p-type MOS (PMOS) transistor. A substrate (or body) contact generally provided for Ring-FET 110 is not shown in FIG. 1C.

GS 117 is shown including a gate electrode 117a on a gate dielectric 117b. The gate electrode 117a can comprise a variety of gate materials including polysilicon, or a metal or metal alloy. The gate dielectric 117b can comprise a variety of gate dielectrics including a high-k dielectric defined herein as having a k-value of at least 5 (vs. 3.9 for silicon oxide), such as SiON or $HfO_2$.

Use of disclosed SGEFETs such as the Ring-FET 110 shown in FIGS. 1B and 1C instead of the conventional linear MOSFET 100 shown in FIG. 1A in switch circuits for providing cAFE's with its inner S 115 connected to an analog bus provides significant performance advantages that are recognized herein. The analog bus terminal S/D area and parasitics are about ¼ versus the conventional linear MOSFET 100 shown in FIG. 1A per gate width (W). Accordingly, either parasitic effects are reduced by about 4× (four times) and the switch performance (e.g., speed) is improved, or about 4× more switches can be placed on the IC. With more switches, many more possible configurations are provided=$2^N$ (N=number of switches). A significantly higher number of user' applications can thus be supported.

Disclosed SGEFETs can be used on a wide variety of different circuits. Regarding an example semiconductor device including a disclosed cAFE including disclosed SGEFETs supporting switchable connection of circuit modules (modules) and IO's to a MCU of an SoC (see FIG. 2A described below), the components more generally include a MCU or field programmable gate array (FPGA), programmable AFE or other programmable analog circuitry, analog bus interconnecting several modules, control circuits, and switch circuits based on disclosed SGEFETS such as Ring-FETS.

Figure 1D:
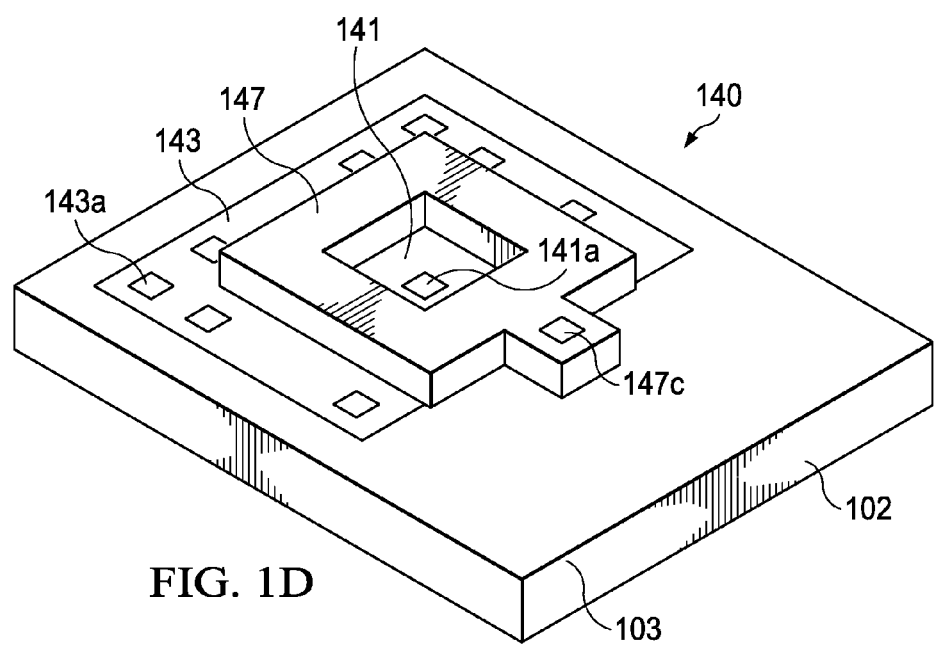
FIG. 1D is a top perspective view of the layout another example Ring-FET variant, according to an example embodiment.
Figure 1E:
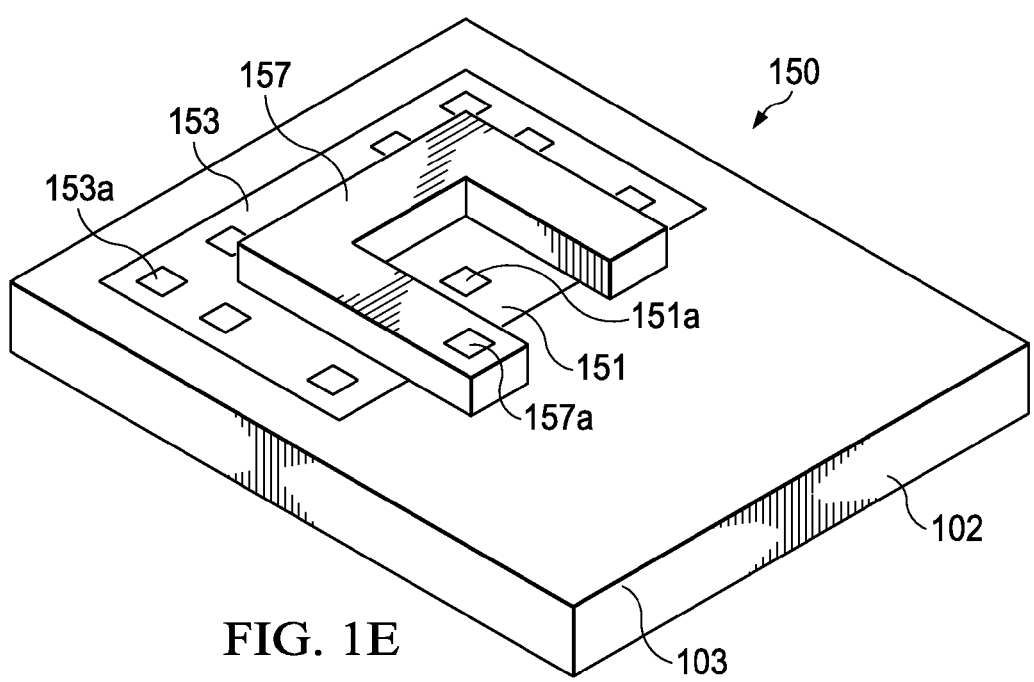
FIG. 1E is a top perspective view of the layout another example U-FET SGEFET variant, according to an example embodiment.
Figure 1F:
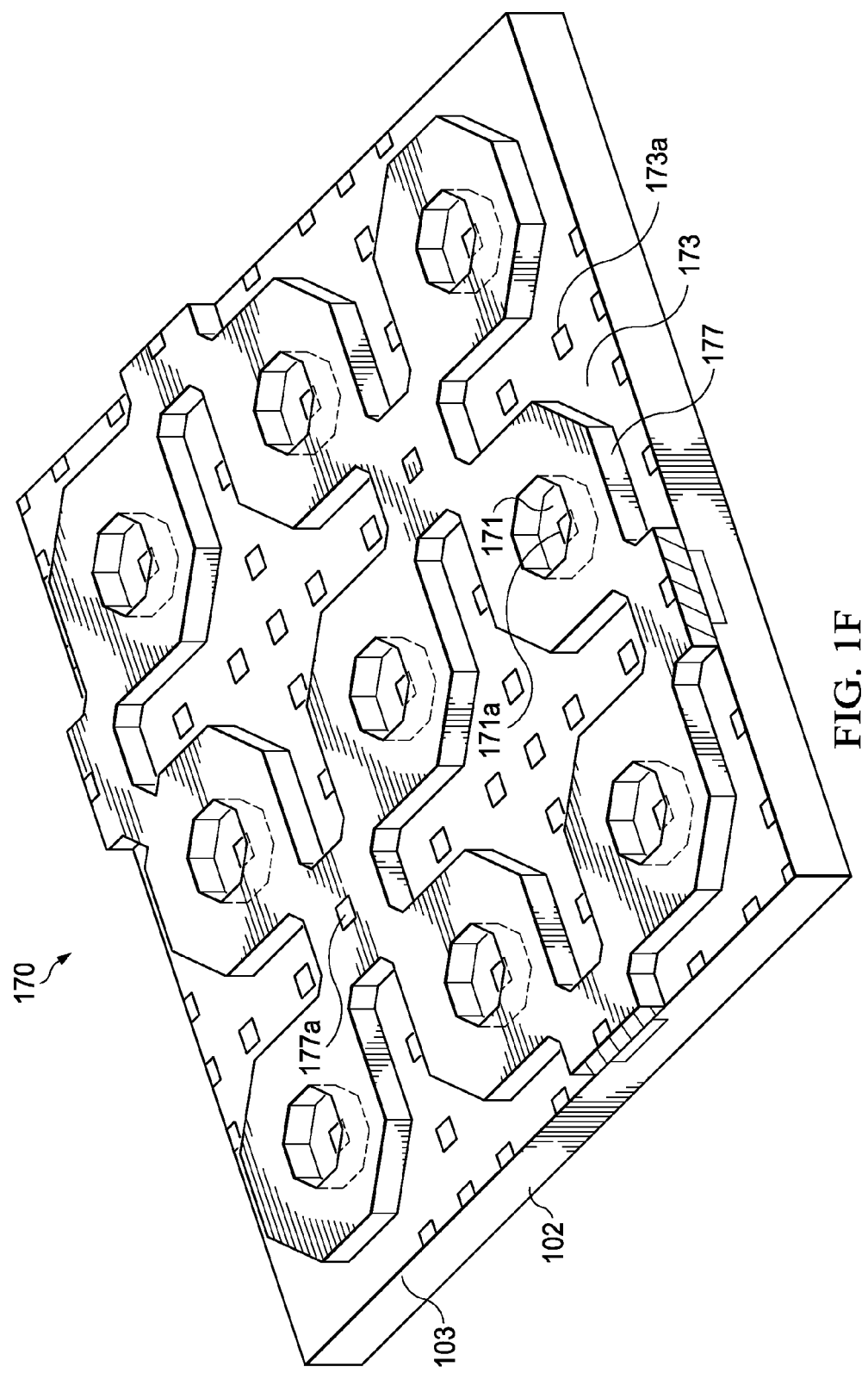
FIG. 1F is a top perspective view of the layout an example waffle structure SGEFET variant, according to an example embodiment.

FIGS. 1D-F describe alternate SGEFET implementations compared to Ring-FET 110. Some variants involve reducing the extent of the G encirclement of the inner electrode to somewhere between 270 degrees (3 sides) and full 360 degrees (provided by Ring-FET 110). These alternate implementations generally provide somewhat less switches and AFE configurability as compared to implementations using Ring-FET 110. For example C-shaped and U-shaped SGEFET implementations are described below.

FIG. 1D is a top perspective view of the layout of an example C-shaped SGEFET 140, according to an example embodiment. Many variants of C-shaped SGEFET 140 can be envisioned by one having ordinary skill in the art. In this embodiment, one inner S or D 141 including contact 141a has three sides enclosed by the outer S or outer D 143 including contacts 143a, and the inner S or D 141 is completely enclosed by gate stack 147 of the SGEFETs 140 with the exception of the gate contact 147c to the gate electrode (gate) of GS 147. The gate of the gate stack 147 can be in a variety of shapes including circular, ellipsoid, rectangular, rectangular with chopped edges or a polygon approximating a circle or ellipsoid shape.

FIG. 1E is a top perspective view of the layout an example U-shaped SGEFET 150, according to an example embodiment. As defined herein, a U-shaped SGEFET has one "inner" S/D-contact/diffusion 151 including contact 151a on three sides surrounded by the transistor gate stack 157 to form a half-circle. The gate stack 157 half-circle maybe circular, ellipsoid, rectangular, rectangular with chopped edges or a polygon approximating a circular shape or ellipsoid. With the exception of the gate contact 157a, the gate stack 157 is surrounded on at least three sides by the outer S/D contact 153 having contacts 153a. Multiple such shapes may be combined in an array or waffle structure to increase the transistor width.

FIG. 1F is a top perspective view of an layout of an example SGEFET waffle structure 170, according to an example embodiment. As shown, multiple SGEFET shapes may be combined in a waffle (or an array) to increase the overall SGEFET width and thus its current drive capability. Several gate stacks are shown with GS 177 identified having gate contact 177a identified, with several inner S or D with inner S or D 171 identified with its contact 171a, and several outer S or D with outer S or outer D 173 identified with its contact 173a.

Figure 2A:
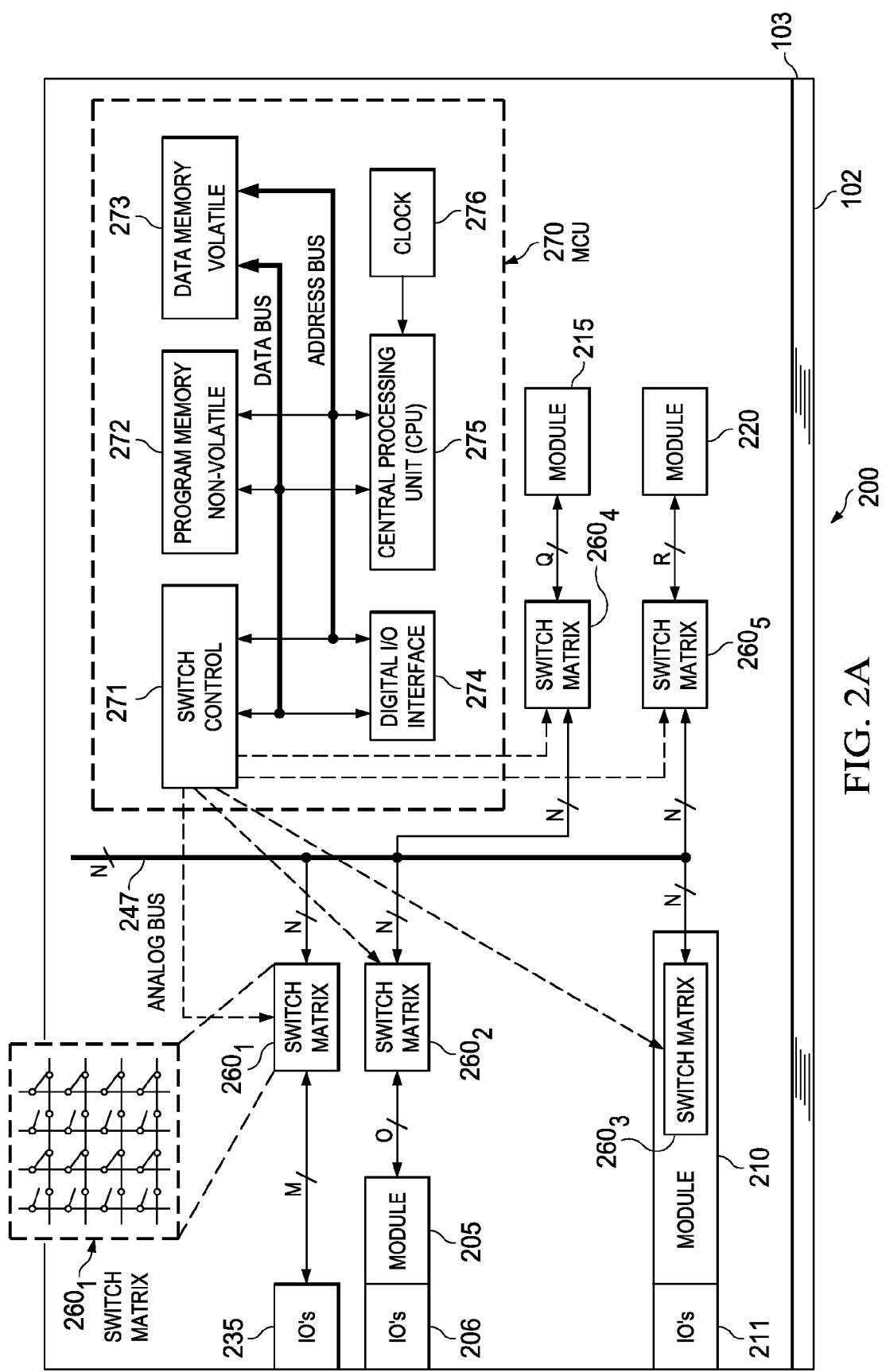
FIG. 2A depicts a block diagram layout of an example semiconductor device including a highly configurable AFE (cAFE) supporting switchable connection of circuit modules and IO's to a MCU of an SoC, where one of the modules has an inner switch matrix, according to an example embodiment.

FIG. 2A depicts a block diagram layout of an example semiconductor device 200 including a cAFE supporting switchable connection of circuit modules (modules) and IO's to one another and to a MCU 270 of an SoC, where one of the modules 210 has a switch matrix $260_3$ therein, according to an example embodiment. Although not shown, the SoC generally includes other integrated circuit modules, for example, a USB controller and a transceiver. MCU 270 is shown including switch control 271, first non-volatile program memory 272, volatile data memory 273, digital I/O (interface) 274, central processing unit (CPU) 275, and clock 276. MCU 270 is also shown including a digital data bus 278 and an address bus 279. Switch control 271 is shown coupled to the respective switch matrices shown as $260_1$, $260_2$, $260_3$, $260_4$ and $260_5$, where control signals provided by switch control 271 control the states of the switches (on or off) in the respective switch matrices. Switch matrix $260_1$ is shown in an expanded depiction above showing a plurality of individual switches (12 example switches shown), where the switches each include disclosed SGEFETs, such as Ring-FETs.

Each switch matrix functions as the configurable link between the analog bus 247 and each module or IO connection, which enables communication from any IO or module to another IO of module, or from any IO or module to the MCU 270. Each individual switch of the switch matrix can connect any of the N bus lines of the analog bus 247 with any of the modules or IO's. The number of lines (connections) to each module (206, 211, 215 or 220) or IOs (235) is indicated in FIG. 2A by the letter shown close to the diagonal line across the line shown coupling to the switch matrix, with M (M>1) connections to IOs 235, O (>1) connections to module 205, N connections to module 210 through a direct connection to analog bus 247, R (>1) connections to module 220, and Q (≥1) connections to module 215 being shown, Q (≥1) reflecting the simplest possible arrangement where a single module is connected by a single line. The switch matrices need not be similar for all connected modules or fully populated with respect to the number of switches. It is not necessary that each line of the analog bus 247 connect to each module connection.

The cAFE is shown including a plurality of modules including modules 205, 210, 215 and 220 coupled by their respective switch matrix to the analog bus 247 which has N bus lines. As noted above modules 210 has a switch matrix $260_3$ inside, while the other modules have bus lines connected to an external switch matrix, with module 205 shown having an analog bus with O (O>1) lines connected to switch matrix $260_2$, where switch matrix $260_2$ is connected to the N lines of analog bus 247. Some of these modules 205 and 210 have direct connections to their respective Pads/IO's 206 and 211, respectively. Other 'internal' modules 215 and 220 have no direct connections to the pads/IO's themselves, and are only switchably connected to analog bus 247. More generally, modules may either be connected to the pads or other modules through several lines of the analog bus 247.

As noted above, disclosed modules may include, but are not limited a variety of different analog or mixed-signal circuit modules including, but not limited to, operational, instrumentation, or transconductance amplifiers power amplifiers (PAs), or other configurable voltage or current mode amplifiers, integrators, filters, sample-and-hold circuits, mixers, ADCs, DACs, comparators, modulators, oscillators (e.g., voltage controlled oscillators), or circuits programmable to such functionality (e.g. switched capacitor circuits). Disclosed CAFEs can also include partial redundancy (e.g. 2 PAs in a given cAFE). Pads/IO's can include digital or analog circuitry as inputs, comparators, buffers, drivers, regulators, current sources, switch connections to other pads, supplies, or internal buses or such circuits as included within the modules.

Figure 2B:
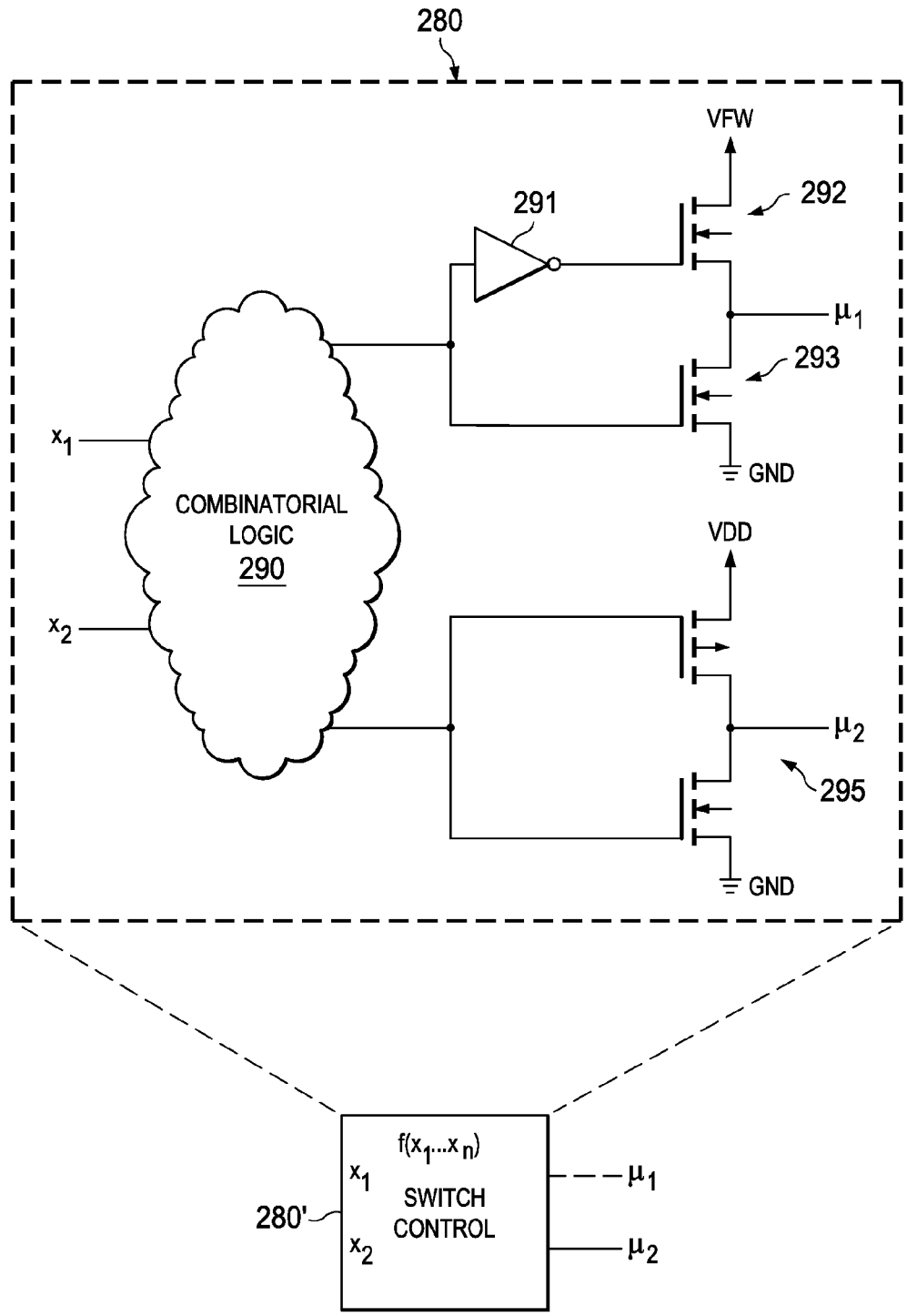
FIG. 2B depicts an example circuit for implementing a portion of a disclosed switch control for controlling NMOS SGEFETs, according to an example embodiments.

FIG. 2B depicts an example circuit 280 for implementing a portion of the switch control 271 shown in FIG. 2A for controlling NMOS SGEFETs, according to an example embodiments, along with its compact block representation 280' analogously used for certain subsequent FIGS. below. Circuit 280 is shown having combinatorial logic 290 (with or without registers) controlled by signals generally received over a data bus and an address bus. For simplicity, a connection from the digital data bus and address bus of the MCU 270 shown in FIG. 2A is not shown in FIG. 2B which provides the $x_1$ and $x_2$ inputs shown to the combinatorial logic 290. Moreover, circuit 280 is limited in its logic circuitry and is only shown providing two outputs ($\mu_1$ and $\mu_2$), where $\mu_1$ and $\mu_2$ are a function of inputs $x_1$ to $x_n$ in block representation 280' in FIG. 2B expressed as $f(x_1 \ldots x_n)$, with $x_1$ and $x_2$ explicitly shown, although in a practical circuit many more outputs for a disclosed switch control are implemented by adding more inputs and more logic circuitry.

Based on inputs $x_1$ and $x_2$ combinatorial logic 290 shown in FIG. 2B drives a first sub-circuit shown including a CMOS inverter 295 which provides an output shown as $\mu_2$, where $\mu_2$ is configured to connect to the gate of a disclosed NMOS or PMOS SGEFET to provide either VDD or GND in order to put the SGEFET into a conducting (on) or non-conducting (off) state. Optionally, by altering the power supply rail voltage(s), the gate of the SGEFET can also be connected to potentials above VDD or below GND to improve switching characteristics.

Combinatorial logic 290 shown in FIG. 2B drives a second sub-circuit parallel to the first sub-circuit shown including a CMOS inverter 291 coupled to the gate of an NMOS transistor 292 which is in series with another NMOS transistor 293, which provides an output shown as $\mu_1$ at the shared node between NMOS transistor 292 and NMOS transistor 293. The VFW power supply shown is generally set at GND±a potential that is below a diode drop, such as ±0.2 V to 0.5 V. $\mu_1$ is thus configured for body bias control for an NMOS SGEFET to improve ITS switching characteristics. To provide a sub-circuit for PMOS SGEFET body bias control, first and second series connected PMOS transistors would replace NMOS 292, 293 and the power supply rail voltages would be VDD and VDD±a potential below a diode drop, such as 0.2 V to 0.5 V.

Regarding body biasing, controlling the potential on the back-gate (body) of SGEFET relies on the body effect which refers to the changes in the threshold voltage of the MOSFET by changing the source-bulk voltage. Because the body potential influences the MOSFET threshold voltage (when it is not tied to a terminal such as the source), it can be thought of as a second gate, and is sometimes referred to as the "back gate"; the body effect is sometimes referred to as the "back-gate effect".

Outputs of disclosed switch circuits can be used to connect to the back-gate of disclosed SGEFET to potentials to change the threshold voltage of the SGEFET by creating a voltage difference between the gate and body terminals. Such a voltage difference generates an electric field which creates an "inversion layer" or "channel" at the semiconductor-gate dielectric interface. The inversion channel is of the same type, p-type or n-type, as the source and drain, thus it provides a channel through which current can pass. Varying the voltage between the gate and body modulates the conductivity of this layer and thereby controls the current flow between drain and source.

Instead of the conventional back gate potential for an n-type SGEFET of GND and for a p-type SGEFET of VDD, a back gate bias can be used to apply forward bias on the device in conducting state and enhance conductivity of a n-type SGEFET using a body potential below VDD (for a p-type SGEFET) or above GND (for a n-type SGEFET). Also, optionally the switch control can generate outputs that connect to the back-gate of the SGEFET to a potential above VDD (for a p-type SGEFET) or below GND (for a n-type SGEFET) to apply reverse bias to the SGEFET and improve its switch shutoff. A switch control (later shown as switch control 450) for cascaded switches or a multiplexer can comprise combinations of the non-inverted and inverted switch control sub-circuits shown in FIG. 2B.

Figure 3A:
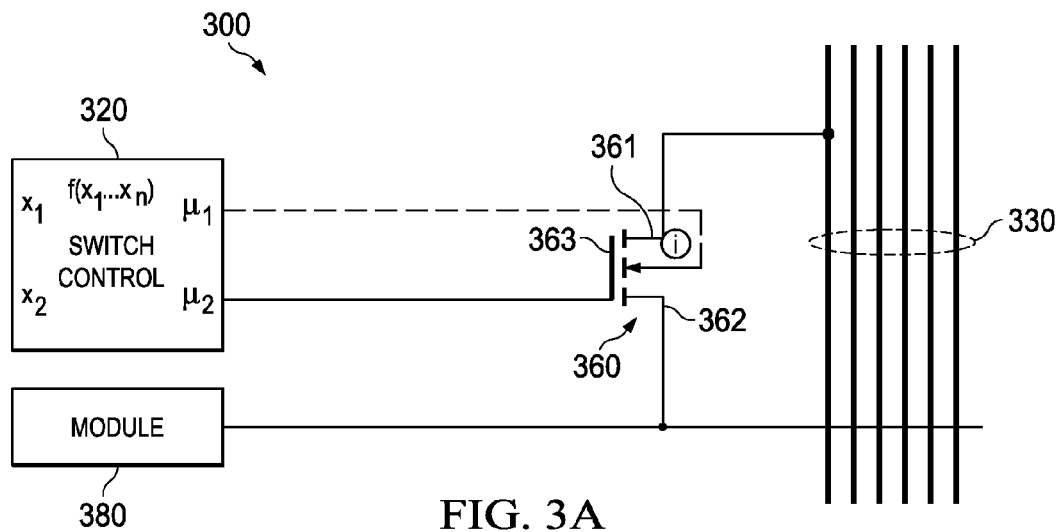
FIGS. 3A and 3B are depictions of single transistor switch and transmission gate implementations including disclosed SGEFETs, respectively, according to example embodiments.
Figure 3B:
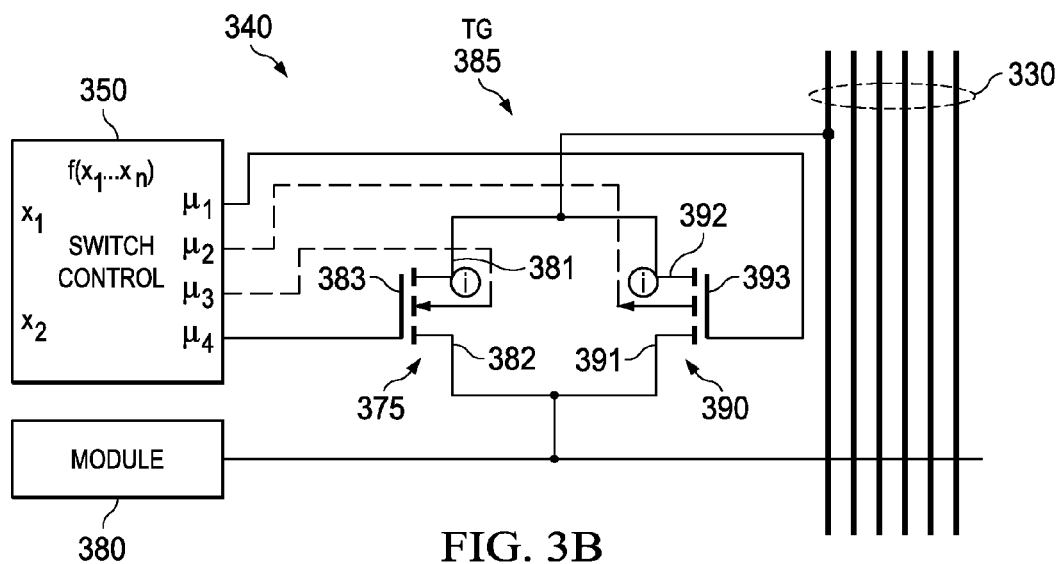

FIGS. 3A and 3B are depictions of a circuit 300 having a single SGEFET switch and a circuit 340 having transmission gate switch implementation, respectively, according to example embodiments. In each case, the inner S or D contact of the SGEFET (indicated by an encircled "i") is directly connected to a bus line of the N bus lines of analog bus 330 to minimize capacitance and junction leakage on the analog bus 330.

In FIG. 3A SGEFET 360 is shown as an NMOS SGEFET which has its inner D 361 connected to a bus line of the analog bus 330 via SGEFET 360. Module 380 is connected to the outer S 362 of SGEFET 360. The G of SGEFET 360 is shown as 363. Switch control shown as 320 provides both gate and body control bias signals to control SGEFET 360, including for turning SGEFET 360 on and off, and for optionally as described above using the body effect for enhancing the conductivity of SGEFET 360 while on and reducing leakage when SGEFET 360 is off. Body biasing may be enhanced further by sensing a potential on one side CLARIFY of the SGEFET 360, such as the node of inner D 361 and regulating the gate and body potential dependent on the sensed potential. In operation of circuit 300, when SGEFET 360 is turned on by switch control 320, module 380 is connected to a bus line of the analog bus 330 permitting bidirectional signal communications.

FIG. 3B depicts a SGEFET switch implementation 340 comprising a transmission gate (TG) 385 including SGEFET 375 as an NMOS transistor and SGEFET 390 as a PMOS transistor in parallel to one another. As known in the art, a TG or analog switch, is defined as an electronic element that selectively blocks or passes a signal level from its input to its output, and comprises a PMOS transistor and NMOS transistor hooked in parallel with separate gate connections, conventionally with the drain of the NMOS transistor tied to the source of the PMOS transistor and the source of the NMOS transistor tied to the drain of the PMOS transistor. However, as noted above, the current direction may be alternating or ill defined, therefore the definition of an electrode as being a S or D can be difficult for both PMOS and NMOS. However, the inner contact (whether a S or a D, or varying) of the SGEFET will be directly connected to the analog bus to reduce parasitic capacitance and leakage as compared to conventional MOS device-based switches. The control gates of the PMOS transistor (SGEFET 390) and NMOS transistor (SGEFET 375) are biased in a complementary manner by switch control 350 so that both the PMOS and NMOS transistors are either both on or both off at any given time. Switch control 350 is shown having inputs $x_1$ to $x_n$ with $x_1$ and $x_2$ explicitly shown as inputs, and having four outputs $\mu_1$, $\mu_2$, $\mu_3$ and $\mu_4$.

SGEFET 375 has its inner drain 381 and SGEFET 390 has its inner source 392 both shown connected to analog bus 330 for minimizing capacitance and leakage on the analog bus 330. The outer drain 391 of SGEFET 390 and the outer source 382 of SGEFET 375 are connected to module 380.

The gate of SGEFET 375 is shown as 383, and the gate of SGEFET 390 is shown as 393. In operation of circuit 340, when switch control 350 turns on TG 385, module 380 is coupled to a bus line of the analog bus 330 through TG 385 permitting bidirectional signal communications.

Figure 4A:
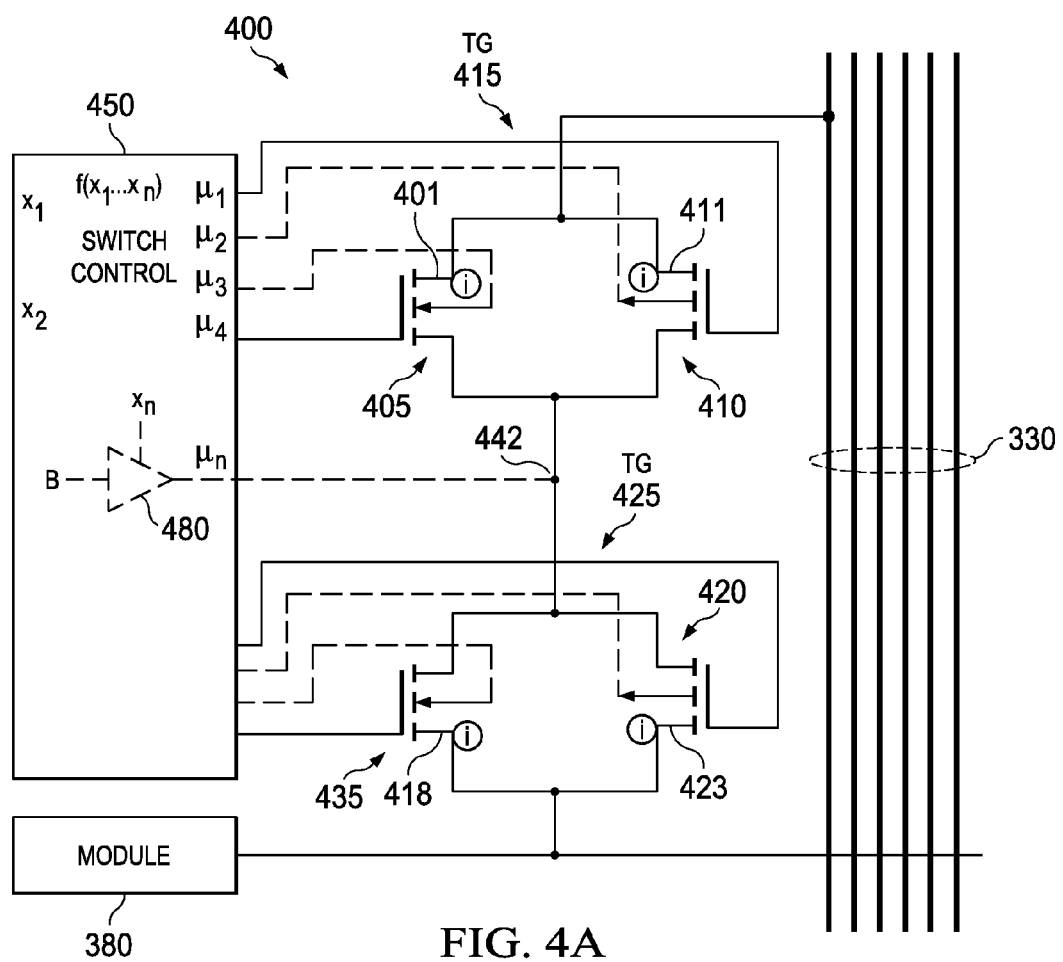
FIGS. 4A and 4B are each depictions of example cascaded switch implementations including disclosed SGEFETs, according to example embodiments.
Figure 4B:
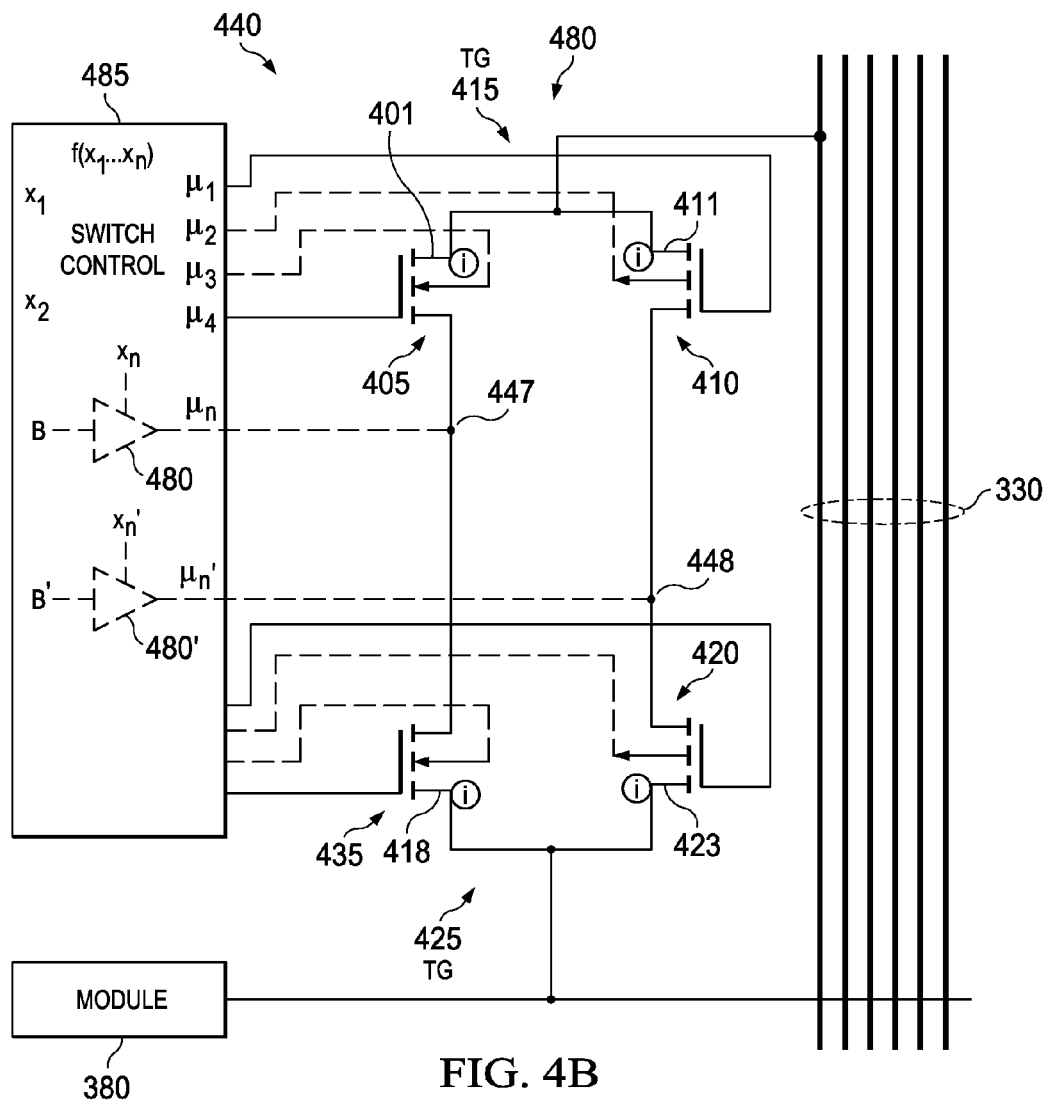

FIGS. 4A and 4B are depictions of example circuits 400 and 440, respectively, having cascaded switch implementations with SGEFETs in the transmission gates shown, according to example embodiments. Switch control is now shown as 450 in FIG. 4A, FIG. 4B as well as in FIG. 5 and FIG. 6 described below, which like switch control 320 and 350 described above can optionally provide backgate biasing, potential sensing and enhanced-cut-off for the SGEFET(s). Switch control 450 is shown having inputs $x_1$ to $x_n$, with $x_1$ and $x_2$ explicitly shown as inputs, and having outputs $\mu_1$, $\mu_2$, $\mu_3$ and $\mu_4$, and additional control circuitry which generates another output shown as $\mu_n$ which is connected to the intermediate node 442 described below.

The switch control 450 is shown also including a buffer circuit 480 that can be based on the arrangement shown in FIG. 5 described below for minimizing leakage in the switching circuitry. Buffer circuit 480 can be a tri-state buffer which can be comprised of a transmission gate, which outputs the potential at the output 531 of the buffer 530 shown in FIG. 5. Alternatively, buffer circuit 480 can be a local complete buffer circuit, such as implemented as a folded cascade. The $\mu_n$ output of the buffer circuit 480 is enabled by the input shown as $x_n$. The input to the buffer circuit 480 shown as B can be connected to a specific potential or to a node, such as to the connected line of analog bus 330 to reduce sub-threshold leakage across NMOS transistor 405 and PMOS transistor 410 between analog bus 330 and intermediate node 442 shown in FIG. 5. More generally, B can be a voltage sensed on the analog bus 330 or elsewhere (e.g., B could be sensed within a module or IO as well).

In FIG. 4A the cascaded SGEFET-based switch comprises TG 415 in series with TG 425 which allows further minimizing the capacitance and leakage on the analog bus 330 as compared to a single SGEFET-based switch, and a single TM switch, such as shown in FIGS. 3A and 3B, respectively.

The inner D 401 of NMOS transistor 405 and the inner S 411 of the PMOS transistor 410 are directly coupled to a bus line of the analog bus 330. The inner S 418 of NMOS transistor 435 and inner D 423 of PMOS transistor 420 are coupled to module 380. There is a connection shown to the intermediate node 442 between TG 415 and TG 425 to the switch control 450. The $\mu_n$ output of switch control 450 provided by buffer circuit 480 is shown driving the intermediate node 442 to a sensed voltage level on one side of the switch and regulating the potential on the intermediate node 442 dependent on the sensed potential. This sensing and sensed-based voltage regulation arrangement can reduce the sub-threshold leakage across the TG's 415 and 425. In operation of circuit 400, when both TG 415 and TG 425 are on, module 380 is connected to a bus line of the analog bus 330 permitting bidirectional signal communications.

FIG. 4B is a variant of FIG. 4A that hooks the NMOS transistors 405 and 435 and the PMOS transistors 410 and 420 of TG's 415 and 425 in series. As in FIG. 4A the inner D 401 of NMOS transistors 405 and the inner S 411 of the PMOS transistor 410 are coupled to the analog bus 330, and the inner S 418 of NMOS transistor 435 and inner D 423 of PMOS transistors 420 are coupled to module 380. The switch control 485 is shown having an output $\mu_n$ provided by buffer circuit 480 to drive the intermediate node 447 between the NMOS transistors 405 and 435 of the TG's 415, 425. The switch control 485 also includes another buffer circuit 480' shown enabled by xn' and having an input B' providing an output $\mu_n$' to drive the intermediate node 448 between the PMOS transistors 410 and 420 of the TG's 415, 425 to a sensed voltage level on one side of the switch and regulate the potential dependent on the sensed potential. This arrangement can reduce the sub-threshold leakage across the TG's. In operation, when both TG 415 and TG 425 are on, module 380 is connected to a bus line of the analog bus 330 permitting bidirectional signal communications.

Figure 5:
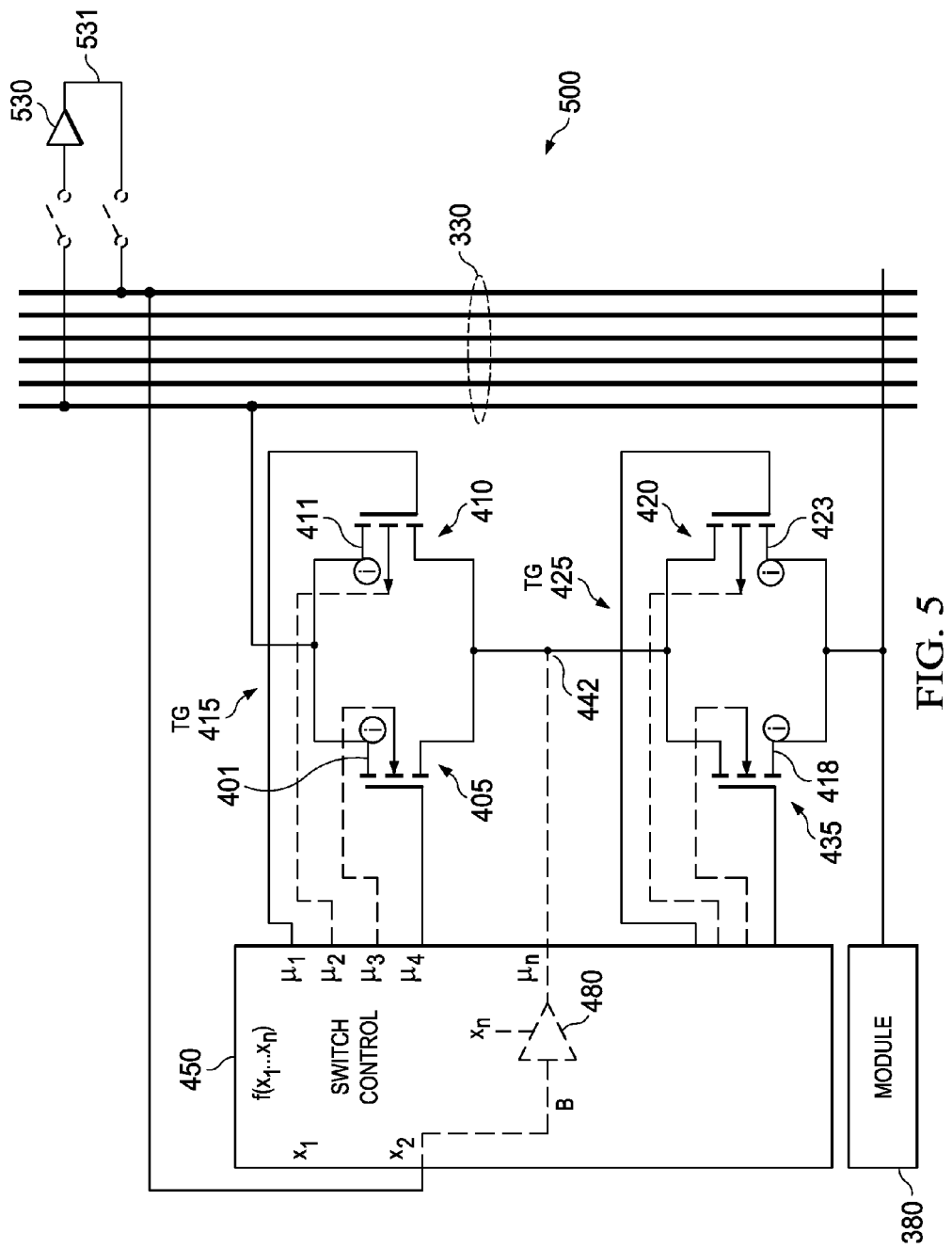
FIG. 5 are schematics for circuits having switches including disclosed SGEFETs as well as buffer circuitry for minimizing leakage, where the analog bus or another line can be used to distribute the buffered voltage level of the line of interest.

FIG. 5 is a circuit schematic 500 based on the layout in FIG. 4A with a buffer 530 added for further minimizing leakage where the analog bus 330 (or another line) is used to distribute the buffered voltage level at the output of the buffer shown as 531 of the line of interest. By connecting to the node at the mid-point between TG 415 and TG 425 of one, multiple, or all of the SGEFET-based TG's 415 and 425 to a buffer 530, such as a unity gain non-inverting operational amplifier, associated sub-threshold leakage of the SGEFETs in TG's 415 and 425 can practically be eliminated. The connection from the input B of the buffer circuit 480 in switch control 450 to one input of the buffer 530 can be used to implement the buffer 530 with a tri-state output.

Figure 6:
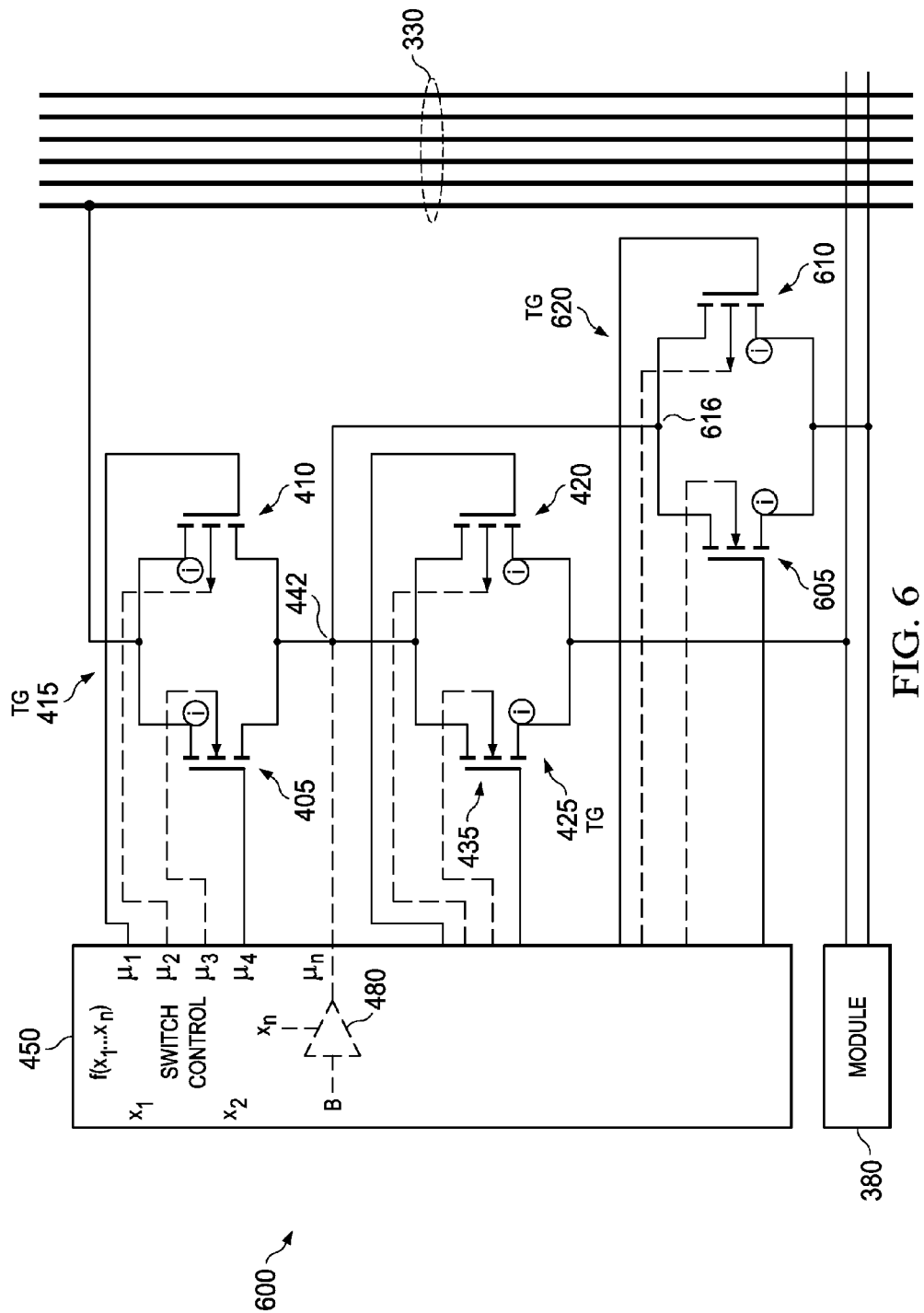
FIG. 6 is an example cascaded multiplexer circuit implementation including disclosed SGEFET-based transmission gates, according to an example embodiment.

FIG. 6 is an example TG and cascaded multiplexer circuit 600 implementation including disclosed SGEFET-based switches, according to an example embodiment. As in FIG. 4A, module 380 is switchably connected to a bus line on the analog bus 330 by TG 415 in series with TG 425 which are both controlled by gate and body bias by switch control 450. Module 380 is also switchably connected to switch control 450 by TG 620 including NMOS transistor 605 and PMOS transistor 610 which is itself controlled by switch control 450. The low parasitic inner electrodes of both NMOS transistor 605 and PMOS transistor 610 are coupled to module 380.

The intermediate node 442 between TG 415 and TG 425 is coupled to node 616 of TG 620, which is shown driven by the $\mu_n$ output of the buffer circuit 480 of switch control 450. In operation of circuit 600, the function provided is similar to other cascaded TGs. To implement the multiplexing in the conducting (on) state of TG 415 either TG 425 or TG 620, or both TG 425 and TG 620, can be switched on into their conducting state. Cascaded multiplexer circuit 600 can include more TG's on either side of the intermediate node 442 and can be combined with the methods described above for leakage detection. Switch control 450 can optionally be implemented with/without back-/forward-biasing/cut-off techniques described above.

Advantages of disclosed embodiments for CAFEs having Ring-FET based switches or more generally SGEFET-based switches, include the same performance with the number of switches being at least be doubled, such as about quadrupled. If one bus determines performance, as noted above since the added capacitance per switch is significantly lower (e.g. ¼ capacitance per switch), the number of switches connected to this bus can be increased by a about factor of 4 (4×). As the number of permutations scales exponentially, configurability increases very significantly so that more applications can be addressed.

Disclosed cAFEs can be used in a variety of ICs as noted above, including SoCs and MCUs, as well as multi-die-chips/SoCs. Some example applications for MCUs include industrial sensors, automation and security, sport watches, and personal medical devices.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A configurable integrated circuit (IC), comprising:
a substrate having a semiconductor surface that said IC is formed within and thereon, said IC including:
a configurable Analog Front End (cAFE) including at least one circuit module or input/output (IO);
an analog switch having at least a first Substantially Gate Enclosed Metal Oxide Semiconductor Field Effect Transistor (SGEFET) having a gate stack including a gate on a gate dielectric, a source, and a drain,
wherein said drain or said source is a Substantially Gate Enclosed (SGE) inner electrode relative to said gate stack and another of said source and said drain is outside said gate stack, and
an analog bus,
wherein said inner electrode of said first SGEFET is directly coupled to said analog bus, and
a switch control that provides control signals to at least said gate of said first SGEFET for controlling a connectivity between said circuit module or said IO and said analog bus.

2. The configurable IC of claim 1, wherein said first SGEFET is a Ring-FET.

3. The configurable IC of claim 1, wherein said analog switch consists of a single transistor.

4. The configurable IC of claim 1, wherein said analog switch further comprises a second SGEFET configured with said first SGEFET to provide a first transmission gate (TG).

5. The configurable IC of claim 4, wherein said analog switch further comprises a third SGEFET and a fourth SGEFET configured together to provide a second TG, said first TG and said second TG in a cascaded TG arrangement having an intermediate node between said first TG and said second TG.

6. The configurable IC of claim 5, wherein said switch control is coupled to both said gate and a body of said first SGEFET and a gate and a body of said second SGEFET in said first TG, to a gate and a body of said third SGEFET and to a gate and a body of said fourth SGEFET in said second TG.

7. The configurable IC of claim 5, further comprising a buffer having an input coupled to a node including said inner electrode of said first SGEFET in said first TG through said analog bus and an output coupled to said switch control.

8. The configurable IC of claim 5, wherein said analog switch comprises a cascaded multiplexer circuit.

9. The configurable IC of claim 1, wherein said circuit module consists of at least one selected from the group consisting of an operational amplifier, an instrumentation amplifier, a transconductance amplifier, a power amplifier (PA), an analog-to-digital converter (ADC), a digital-to-analog converter (DAC), an integrator, a filter, a mixer, a comparator, a modulator, and an oscillator.

10. The configurable IC of claim 1, wherein said configurable IC comprises a microcontroller unit (MCU), said MCU including:
said switch control, a program memory, digital I/O interface, and a central processing unit (CPU) each coupled to an address bus and to a data bus,
wherein said analog switch comprises at least one switch matrix including said first SGEFET and at least a second SGEFET,
wherein said at least one circuit module or input/output (IO) comprises a plurality of said circuit modules, and
wherein said switch control is coupled to said analog bus by said switch matrix.

11. The configurable IC of claim 10, wherein said switch matrix consists of a single switch matrix.

12. The configurable IC of claim 10, wherein said switch matrix includes a plurality of said switch matrices, wherein at least one of said plurality of said switch matrices is inside one of said plurality of said circuit modules or said IO's.

13. A configurable integrated circuit (IC), comprising:
a substrate having a semiconductor surface that said IC is formed within and thereon, said IC including:
a configurable Analog Front End (cAFE) including at least one circuit module or input/output (IO);
an analog switch having at least a first Ring-FET having a gate stack including a gate on a gate dielectric, a source, and a drain,
wherein said drain or said source is an enclosed inner electrode relative to said gate stack and another of said source and said drain is outside said gate stack, and
an analog bus,
wherein said inner electrode of said first Ring-FET is directly coupled to said analog bus, and
a switch control that provides control signals to at least said gate of said first Ring-FET for controlling a connectivity between said circuit module or said IO and said analog bus.

14. The configurable IC of claim 13, wherein said analog switch further comprises a second Ring-FET configured with said first Ring-FET to provide a first transmission gate (TG).

15. The configurable IC of claim 14, wherein said analog switch further comprises a third Ring-FET and a fourth Ring-FET configured together to provide a second TG, said first TG and said second TG in a cascaded TG arrangement having an intermediate node between said first TG and said second TG.

16. The configurable IC of claim 15, wherein said switch control is coupled to said gate and a body of said first Ring-FET and to a gate and a body of said second Ring-FET in said first TG, and to a gate and a body of said third Ring-FET and to a gate and a body of said fourth Ring-FET in said second TG.

17. The configurable IC of claim 15, further comprising a buffer having an input coupled to a node including said inner electrode of said first Ring-FET in said first TG through said analog bus and an output coupled to said switch control.

18. The configurable IC of claim 15, wherein said analog switch comprises a cascaded multiplexer circuit.

* * * * *